(12) United States Patent
Kim et al.

(10) Patent No.: US 11,460,506 B2
(45) Date of Patent: Oct. 4, 2022

(54) APPARATUS AND METHOD FOR DETERMINING DIFFERENTIAL VOLTAGE CURVE OF BATTERY AND BATTERY PACK COMPRISING THE APPARATUS

(71) Applicant: LG CHEM, LTD., Seoul (KR)

(72) Inventors: Young-Deok Kim, Daejeon (KR); Su-Won Jee, Daejeon (KR); Dae-Soo Kim, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 101 days.

(21) Appl. No.: 17/269,834

(22) PCT Filed: Apr. 22, 2020

(86) PCT No.: PCT/KR2020/005323
§ 371 (c)(1),
(2) Date: Feb. 19, 2021

(87) PCT Pub. No.: WO2020/218826
PCT Pub. Date: Oct. 29, 2020

(65) Prior Publication Data
US 2021/0199723 A1 Jul. 1, 2021

(30) Foreign Application Priority Data
Apr. 22, 2019 (KR) .................. 10-2019-0046840

(51) Int. Cl.
*G01R 31/36* (2020.01)
*G01R 31/392* (2019.01)
*G01R 31/382* (2019.01)
(52) U.S. Cl.
CPC ....... *G01R 31/3648* (2013.01); *G01R 31/382* (2019.01); *G01R 31/392* (2019.01)

(58) Field of Classification Search
None
See application file for complete search history.

(56) References Cited

U.S. PATENT DOCUMENTS

2011/0012604 A1 1/2011 Tsujiko et al.
2012/0056590 A1 3/2012 Amiruddin et al.
(Continued)

FOREIGN PATENT DOCUMENTS

CN 108604680 A 9/2018
JP 2009-252381 A 10/2009
(Continued)

OTHER PUBLICATIONS

Extended European Search Report dated Nov. 26, 2021 in corresponding European Patent Application No. 20794066.9.
(Continued)

*Primary Examiner* — Brent A. Fairbanks
(74) *Attorney, Agent, or Firm* — Morgan, Lewis & Bockius LLP

(57) ABSTRACT

An apparatus for determining a differential voltage curve of a battery includes a constant current unit, a sensing unit outputting a sensing signal indicating a voltage and a current of the battery, and a control unit determining a control history indicating the voltage and a remaining capacity of the battery based on the sensing signal. The control unit outputs a first request message when the remaining capacity is outside of a first range of interest, and a second request message when the remaining capacity is within the first range of interest. The constant current unit discharges the battery with a constant current of a first current rate in response to the first request message, and discharges the battery with a constant current of a second current rate in
(Continued)

response to the second request message. The control unit determines the differential voltage curve when the remaining capacity reaches a threshold.

11 Claims, 10 Drawing Sheets

(56) References Cited

U.S. PATENT DOCUMENTS

| | | | |
|---|---|---|---|
| 2012/0226455 A1 | 9/2012 | Kumashiro et al. | |
| 2015/0340885 A1* | 11/2015 | Baek | H02J 7/0071 |
| | | | 320/160 |
| 2016/0061908 A1 | 3/2016 | Torai et al. | |
| 2016/0181833 A1 | 6/2016 | Araki et al. | |
| 2016/0233691 A1* | 8/2016 | Sumi | H01M 4/366 |
| 2016/0254687 A1 | 9/2016 | Tanaka et al. | |
| 2017/0187201 A1* | 6/2017 | Wang | G01R 31/3835 |
| 2017/0234930 A1* | 8/2017 | Lee | H01M 10/48 |
| | | | 320/162 |

FOREIGN PATENT DOCUMENTS

| | | |
|---|---|---|
| JP | 2013-539594 A | 10/2013 |
| JP | 2014-92471 A | 5/2014 |
| JP | 2015-104138 A | 6/2015 |
| JP | 5779528 B2 | 9/2015 |
| KR | 10-2015-0133587 A | 11/2015 |
| KR | 10-2016-0026766 A | 3/2016 |
| KR | 10-2017-0023583 A | 3/2017 |
| KR | 10-1897859 B1 | 9/2018 |
| WO | 2015/080285 A1 | 6/2015 |

OTHER PUBLICATIONS

International Search Report (with partial translation) and Written Opinion issued in corresponding International Patent Application No. PCT/KR2020/005323, dated Aug. 21, 2020.

* cited by examiner

APPARATUS AND METHOD FOR DETERMINING DIFFERENTIAL VOLTAGE CURVE OF BATTERY AND BATTERY PACK COMPRISING THE APPARATUS

TECHNICAL FIELD

The present disclosure relates to technology for determining a differential voltage curve of a battery.

The present application claims priority to Korean Patent Application No. 10-2019-0046840 filed in the Republic of Korea on Apr. 22, 2019, the disclosure of which is incorporated herein by reference.

BACKGROUND ART

Recently, there has been a dramatic increase in demand for portable electronic products such as laptop computers, video cameras and mobile phones, and with the extensive development of electric vehicles, accumulators for energy storage, robots and satellites, many studies are being made on high performance batteries that can be recharged repeatedly.

Currently, commercially available batteries include nickel-cadmium batteries, nickel-hydrogen batteries, nickel-zinc batteries, lithium batteries and the like, and among them, lithium batteries have little or no memory effect, and thus they are gaining more attention than nickel-based batteries for their advantages that recharging can be done whenever it is convenient, the self-discharge rate is very low and the energy density is high.

There are a variety of techniques for state of health (SOH) diagnosis of batteries. For example, Patent Literature discloses acquiring information associated with SOH of a battery from a differential voltage curve (also known as a 'Q-dV/dQ' curve or a 'Q-dV/dSOC' curve) of the battery using differential Voltage Analysis or 'DVA'. The Q-dV/dQ curve may be represented as a graph having a Q axis and a dV/dQ axis. Here, Q denotes a remaining capacity of the battery, V denotes a voltage of the battery, dQ denotes a change in Q, dV denotes a change in V, and dV/dQ denotes a ratio of dV to dQ. For example, it is possible to estimate the SOH of the battery based on the location of feature points appearing on the Q-dV/dQ curve or the distance of the feature points.

As the voltage V of the battery is sensitive to the internal resistance or the temperature of the battery, the Q-dV/dQ curve obtained by charging or discharging the battery with a constant current of a high current rate is unsuitable for precise SOH determination of the battery. Accordingly, to determine the Q-dV/dQ curve, it is general to charge or discharge the battery with a constant current of a low current rate (e.g., 0.05 C).

However, it takes a very long time to determine the Q-dV/dQ curve of the battery using the low current rate. For example, it take about 20 hours to fully discharge a fully charged battery with a constant current of 0.05 C.

(Patent Literature) Japanese Patent Publication No. 2009-252381 (published on Oct. 29, 2009)

DISCLOSURE

Technical Problem

The present disclosure is designed to solve the above-described problem, and therefore the present disclosure is directed to providing an apparatus, method and battery pack that reduces the time required to determine a differential voltage curve (a Q-dV/dQ curve) of a battery by adjusting a current rate of a constant current for the charge or discharge of the battery based on whether a remaining capacity (a state of charge) of the battery is within a range of interest.

These and other objects and advantages of the present disclosure may be understood by the following description and will be apparent from the embodiments of the present disclosure. In addition, it will be easily understood that the objects and advantages of the present disclosure may be realized by the means set forth in the appended claims and a combination thereof.

Technical Solution

An apparatus according to an aspect of the present disclosure is for determining a differential voltage curve of a battery. The apparatus includes a constant current unit configured to control a current of the battery, a sensing unit configured to output a sensing signal indicating a voltage and the current of the battery at each unit time, and a control unit operably coupled to the sensing unit. The control unit is configured to determine a control history indicating the voltage and a remaining capacity of the battery at each unit time based on the sensing signal. The control unit is configured to selectively output a first request message to the constant current unit based on the remaining capacity when the remaining capacity is outside of a first range of interest. The control unit is configured to output a second request message to the constant current unit when the remaining capacity is within the first range of interest. The constant current unit is configured to discharge the battery with a constant current of a first current rate in response to the first request message. The constant current unit is configured to discharge the battery with a constant current of a second current rate lower than the first current rate in response to the second request message. The control unit is configured to determine the differential voltage curve based on the control history when the remaining capacity reaches a threshold.

The control unit may be configured to output a third request message to the constant current unit, when the remaining capacity is between a lower limit of the first range of interest and an upper limit of the second range of interest. The constant current unit may be configured to discharge the battery with a constant current of a third current rate higher than the second current rate in response to the third request message.

The control unit may be configured to output a fourth request message to the constant current unit, when the remaining capacity is within the second range of interest. The constant current unit may be configured to discharge the battery with a constant current of a fourth current rate lower than the third current rate in response to the fourth request message.

The fourth current rate may be equal to or lower than the second current rate.

The threshold may be equal to or lower than a lower limit of the second range of interest.

The control unit may be configured to determine the first range of interest associated with a maximum capacity of the battery from a first data table in which a correlation between the maximum capacity and the range of interest is recorded, using the maximum capacity of the battery as an index.

The control unit may be configured to determine the first current rate and the second current rate associated with a maximum capacity of the battery from a second data table in which a correlation between the maximum capacity and the current rates are recorded, using the maximum capacity of the battery as an index.

The control unit may be configured to output the first request message to the constant current unit when the remaining capacity is higher than an upper limit of the first range of interest.

The control unit may be configured to output the fourth request message to the constant current unit when the remaining capacity is lower than the upper limit of the second range of interest.

A battery pack according to another aspect of the present disclosure includes the apparatus.

A method according to another aspect of the present disclosure is for determining the differential voltage curve using the apparatus. The method includes determining, by the control unit, a control history indicating a voltage and a remaining capacity of the battery at each unit time, selectively outputting, by the control unit, a first request message to the constant current unit based on the remaining capacity when the remaining capacity is outside of a first range of interest, the first request message inducing the constant current unit to discharge the battery with a constant current of a first current rate to the constant current unit, outputting, by the control unit, a second request message when the remaining capacity is within the first range of interest, the second request message inducing the constant current unit to discharge the battery with a constant current of a second current rate lower than the first current rate, and determining, by the control unit, the differential voltage curve based on the control history when the remaining capacity reaches a threshold.

Advantageous Effects

According to at least one of the embodiments of the present disclosure, it is possible to reduce the time required to determine a differential voltage curve of a battery by adjusting a current rate of a constant current for charging or discharging of the battery based on whether a remaining capacity (or a state of charge) of the battery is within a range of interest.

Additionally, it is possible to effectively track key feature point(s) on the differential voltage curve of the battery that changes in location as the battery degrades, by changing the range of interest based on a maximum capacity of the battery.

Additionally, it is possible to reduce the distortion phenomenon in intensity or position of the key feature point(s) on the differential voltage curve of the battery, by changing the current rate of the constant current for the charge or discharge of the battery inside or outside of the range of interest based on the maximum capacity of the battery.

The effects of the present disclosure are not limited to the above-mentioned effects, and these and other effects will be clearly understood by those skilled in the art from the appended claims.

BRIEF DESCRIPTION OF THE DRAWINGS

The accompanying drawings illustrate a preferred embodiment of the present disclosure, and together with the detailed description of the present disclosure described below, serve to provide a further understanding of the technical aspects of the present disclosure, and thus the present disclosure should not be construed as being limited to the drawings.

DETAILED DESCRIPTION

Figure 1:
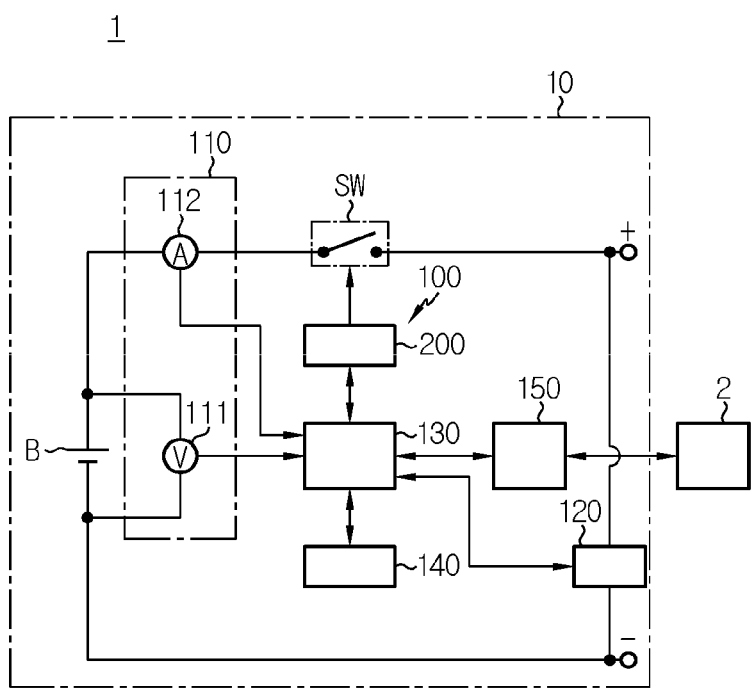
FIG. 1 is a diagram illustrating a configuration of a battery pack according to an embodiment of the present disclosure.

Hereinafter, the preferred embodiments of the present disclosure will be described in detail with reference to the accompanying drawings. Prior to the description, it should be understood that the terms or words used in the specification and the appended claims should not be construed as being limited to general and dictionary meanings, but rather interpreted based on the meanings and concepts corresponding to the technical aspects of the present disclosure on the basis of the principle that the inventor is allowed to define the terms appropriately for the best explanation.

Therefore, the embodiments described herein and illustrations shown in the drawings are just a most preferred embodiment of the present disclosure, but not intended to fully describe the technical aspects of the present disclosure, so it should be understood that a variety of other equivalents and modifications could have been made thereto at the time that the application was filed.

The terms including the ordinal number such as "first", "second" and the like, are used to distinguish one element from another among various elements, but not intended to limit the elements by the terms.

Unless the context clearly indicates otherwise, it will be understood that the term "comprises" when used in this specification, specifies the presence of stated elements, but does not preclude the presence or addition of one or more other elements. Additionally, the term "control unit" as used herein refers to a processing unit of at least one function or operation, and may be implemented by either hardware or software or a combination of hardware and software.

In addition, throughout the specification, it will be further understood that when an element is referred to as being "connected to" another element, it can be directly connected to the other element or intervening elements may be present.

Figure 2:
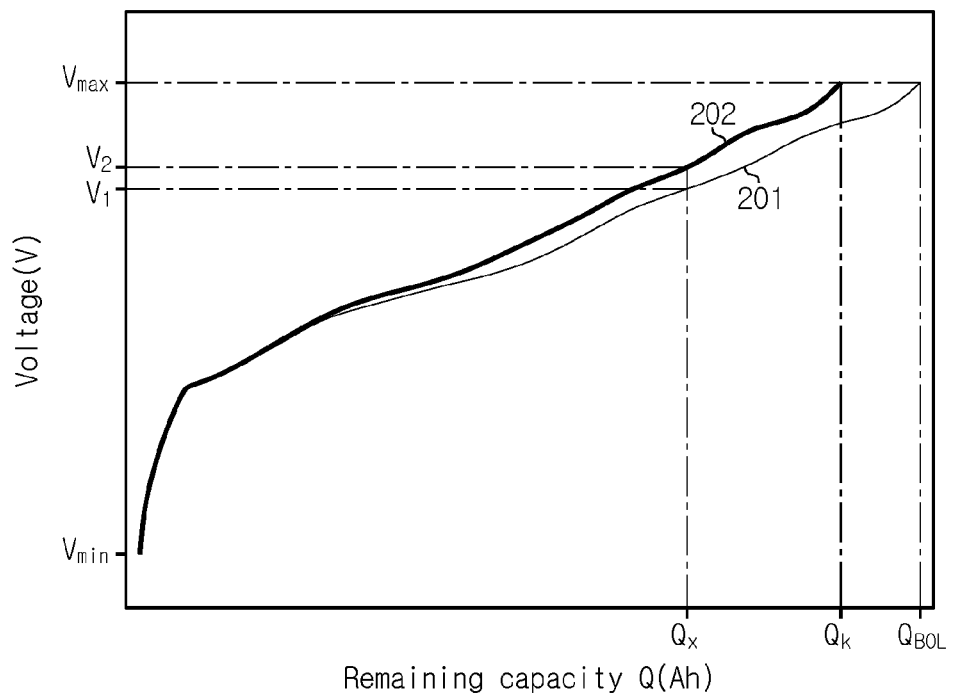
FIG. 2 is a graph illustrating a remaining capacity-voltage curve of a battery at beginning of life and a remaining capacity-voltage curve of a degraded battery.

FIG. 1 is a diagram illustrating a configuration of a battery pack according to an embodiment of the present disclosure, and FIG. 2 is a graph illustrating a Q-V curve of a battery at beginning of life (BOL) and a Q-V curve of a degraded battery.

Referring to FIG. 1, the battery pack 10 is provided to be mounted in an electric system 1 (e.g., an electric vehicle), and includes a battery B, a switch SW and an apparatus 100. The apparatus 100 may be implemented as a Battery Management System (BMS).

Positive and negative terminals of the battery B are electrically connected to the apparatus 100. The battery B may be a rechargeable battery such as a lithium ion battery.

The switch SW is electrically connected to a current path for the charge and discharge of the battery B. The switch SW may be a mechanical relay that is turned on or off by the magnetic force of a coil or a semiconductor switch such as a Metal Oxide Semiconductor Field Effect transistor (MOSFET). While the switch SW is turned on, the battery B may be charged and discharged. While the switch SW is turned off, the charge and discharge of the battery B is stopped. The switch SW may be turned on in response to a first control signal (e.g., a high-level voltage). The switch SW may be turned off in response to a second control signal (e.g., a low-level voltage).

The apparatus 100 is provided to determine a state of health (SOH) of the battery B. The apparatus 100 includes a sensing unit 110, a constant current unit 120, a control unit 130 and a memory unit 140. The apparatus 100 may further include an interface unit 150. The apparatus 100 may further include a switch driver 200.

The sensing unit 110 includes a voltage sensor 111 and a current sensor 112. The voltage sensor 111 is electrically connected to the positive and negative terminals of the battery B. The voltage sensor 111 is configured to periodically measure a voltage across the battery B at each predetermined unit time (e.g., 1 ms) during the charge or discharge of the battery B. The current sensor 112 is installed on the current path for the charge and discharge of the battery B. The current sensor 112 is configured to periodically measure an electric current flowing through the battery B at each unit time during the charge or discharge of the battery B. The sensing unit 110 is configured to output, to the control unit 130, sensing information indicating the voltage and the current of the battery B at each unit time, measured by the voltage sensor 111 and the current sensor 112.

The constant current unit 120 is electrically connected to the current path for the charge and discharge of the battery B. The constant current unit 120 is configured to control a current rate of a constant current for the charge or discharge of the battery B in response to a command from the control unit 130. The constant current unit 120 may charge or discharge the battery B by selective use of at least two current rates. To this end, the constant current unit 120 may include at least two constant current circuits configured to charge or discharge the battery B at different current rates.

The control unit 130 may be implemented in hardware using at least one of application specific integrated circuits (ASICs), digital signal processors (DSPs), digital signal processing devices (DSPDs), programmable logic devices (PLDs), field programmable gate arrays (FPGAs), microprocessors and electrical units for performing other functions.

The control unit 130 is operably coupled to the constant current unit 120 and the sensing unit 110. The control unit 130 is configured to determine a control history based on the sensing information from the sensing unit 110. The control history includes data indicating the voltage and the remaining capacity of the battery B at each unit time. The control history may further include data indicating a change in the voltage of the battery B and a change in the remaining capacity at each unit time. The remaining capacity of the battery B refers to the quantity of charge stored in the battery B, and may be determined by accumulating the current of the battery B at each unit time. The remaining capacity of the battery B may be replaced with a State-Of-Charge (SOC). The SOC of the battery B indicates a ratio of the remaining capacity of the battery to the maximum capacity of the battery B, and is generally expressed as 0~1 or 0~100%. The control history at each unit time may be recorded in the memory unit 140 by the control unit 130.

The control unit 130 may determine a ratio dV/dQ of a change in voltage dV to a change in remaining capacity dQ at each unit time based on the control history at each unit time.

When at least one of predetermined event(s) occurs, the control unit 130 may command the switch driver 200 to turn on the switch SW. In other situations, the control unit 130 may command the switch driver 200 to turn off the switch SW.

The memory unit 140 is operably coupled to the control unit 130. The memory unit 140 may be also operably coupled to the sensing unit 110. The memory unit 140 may be configured to store the sensing information at each unit time from the sensing unit 110. The memory unit 140 may store data and programs required for the calculation operation by the control unit 130. The memory unit 140 may store data indicating the results of the calculation operation (e.g., the control history) by the control unit 130.

The memory unit 140 may include, for example, at least one type of storage medium of flash memory type, hard disk type, Solid State Disk (SSD) type, Silicon Disk Drive (SDD) type, multimedia card micro type, random access memory (RAM), static random access memory (SRAM), read-only memory (ROM), electrically erasable programmable read-only memory (EEPROM) and programmable read-only memory (PROM).

The switch driver 200 is electrically coupled to the apparatus 100 and the switch SW. The switch driver 200 is configured to selectively output the first control signal or the second control signal to the switch SW in response to the command from the apparatus 100. The output of the second control signal may be the stop of the output of the first control signal.

Referring to FIG. 2, there are two different remaining capacity-voltage curves 201, 202. The remaining capacity-voltage curve may be referred to as a 'Q-V curve'. The Q-V curve 201 indicates a relationship between the remaining capacity Q and the voltage V of the battery B when the battery B was at BOL. The Q-V curve 202 indicates a relationship between the remaining capacity Q and the voltage V of the degraded battery B. The control unit 130 may determine the Q-V curve 202 based on the control history at each unit time. The Q-V curve 201 may be stored in the memory unit 140.

At a predetermined end-of-charge voltage $V_{max}$, the remaining capacity $Q_k$ of the Q-V curve 202 is smaller than the maximum capacity $Q_{BOL}$ of the Q-V curve 201. The remaining capacity $Q_{BOL}$ indicates the maximum capacity of the battery B at BOL where the battery B was new. The remaining capacity $Q_k$ indicates the maximum capacity of the battery B at a specific time at which the battery B degraded. This reveals the fact that as the battery B degrades, the remaining capacity $Q_k$ gradually reduces and a difference between the remaining capacity $Q_{BOL}$ and the remaining capacity $Q_k$ increases.

At a specific remaining capacity $Q_x$, a voltage $V_1$ of the Q-V curve 201 is lower than a voltage $V_2$ of the Q-V curve 202. That is, in the same charge condition (or the same discharge condition), as the battery B degrades, the voltage of the battery B changes rapidly.

The interface unit 150 is configured to support wired or wireless communication between the control unit 130 and a high-level controller 2 (e.g., an Electronic Control Unit (ECU)) of the electric system 1. The wired communication may be, for example, controller area network (CAN) communication, and the wireless communication may be, for example, Zigbee or Bluetooth communication. The communication protocol is not limited to a particular type, and may include any type of communication protocol that supports the wired or wireless communication between the control unit 130 and the high-level controller 2. The interface unit 150 may include an output device such as a display or a speaker to provide the process results about the SOH of the battery B performed by the control unit 130 in a recognizable form by the user. The interface unit 150 may include an input device such as a mouse and a keyboard to receive an input of data from the user.

The control unit 130 may determine the maximum capacity $Q_k$ of the battery B using the following Equation 1.

$$Q_k = \frac{\int_{t_1}^{t_2} i_t \, dt}{SOC_2 - SOC_1} = \frac{\Delta C}{\Delta SOC} \quad \langle \text{Equation 1} \rangle$$

In Equation 1, $SOC_1$ denotes the SOC of the battery B at the time $t_1$, $SOC_2$ denotes the SOC of the battery B at the time $t_2$, $\Delta SOC$ denotes a change in SOC between the time $t_1$ and the time $t_2$, $i_t$ denotes a current value indicating the current detected by the current sensor 112 at the time t between the time $t_1$ and the time $t_2$, $\Delta C$ denotes a cumulative current value for a period of time between the time $t_1$ and the time $t_2$, and $Q_k$ denotes the maximum capacity of the battery 20 at the time $t_2$. In relation to Equation 1, when $\Delta SOC$ is too small, there may be a large difference between $Q_k$ and the actual maximum capacity. Accordingly, the control unit 130 may be configured to determine the maximum capacity $Q_k$ of the battery 20 using Equation 1 only when $\Delta SOC$ is equal to or higher than a predetermined value (e.g., 0.5). While $\Delta SOC$ is lower than the predetermined value (e.g., 0.5), the control unit 130 may use the latest estimated maximum capacity as the current maximum capacity (or capacity retention).

The control unit 130 may determine a degradation ratio of the battery B based on a difference between the maximum capacity $Q_{BOL}$ and the maximum capacity $Q_k$. The degradation ratio of the battery B indicates how much the maximum capacity $Q_k$ of the battery B is reduced from the maximum capacity $Q_{BOL}$. The control unit 130 may determine the degradation ratio of the battery B using the following Equation 2.

$$D_k = \frac{Q_{BOL} - Q_k}{Q_{BOL}} \times 100(\%) \quad \langle \text{Equation 2} \rangle$$

In Equation 2, $Q_{BOL}$ denotes the maximum capacity at BOL (referred to as 'design capacity'), $Q_k$ denotes the maximum capacity of the battery B at the specific time, and $D_k$ denotes the degradation ratio of the battery B at the specific time. For example, when $Q_{BOL}$ is 50 Ah and $Q_k$ is 45 Ah, $D_k$ is 10%.

Hereinafter, a method for determining a differential voltage curve of the battery B will be described in detail. The term 'range of interest' as used herein is a remaining capacity range (or an SOC range) in which key feature point(s) associated with the SOH of the battery B is clearly observed among all feature points appearing on the differential voltage curve of the battery B. Data associated with each range of interest may be acquired through experiments for other battery(s) manufactured with the same electrical and chemical property as the battery B and stored in the memory unit 140.

Figure 3:
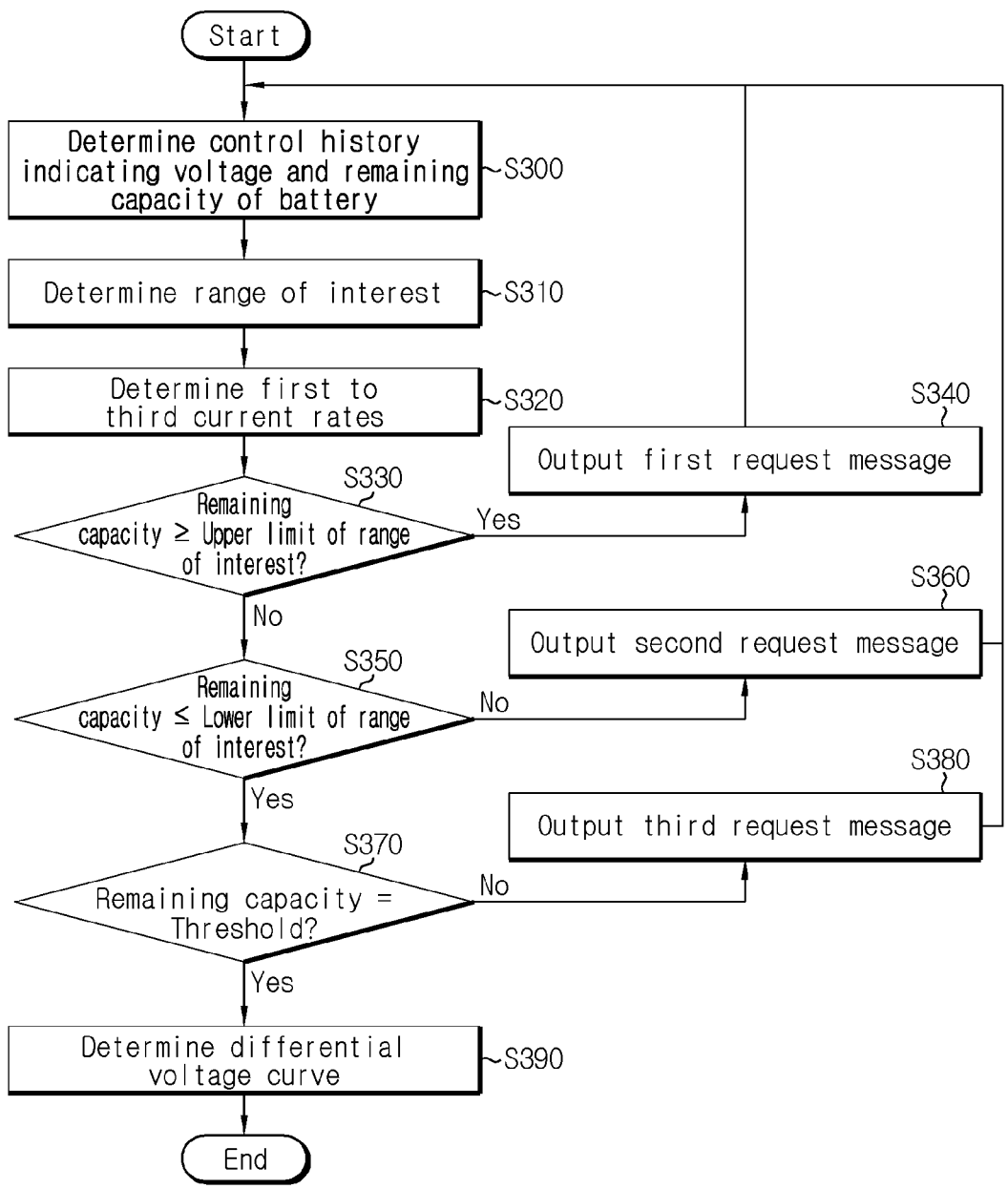
FIG. 3 is a flowchart illustrating a method for determining a differential voltage curve of a battery using the apparatus of FIG. 1.
Figure 4:
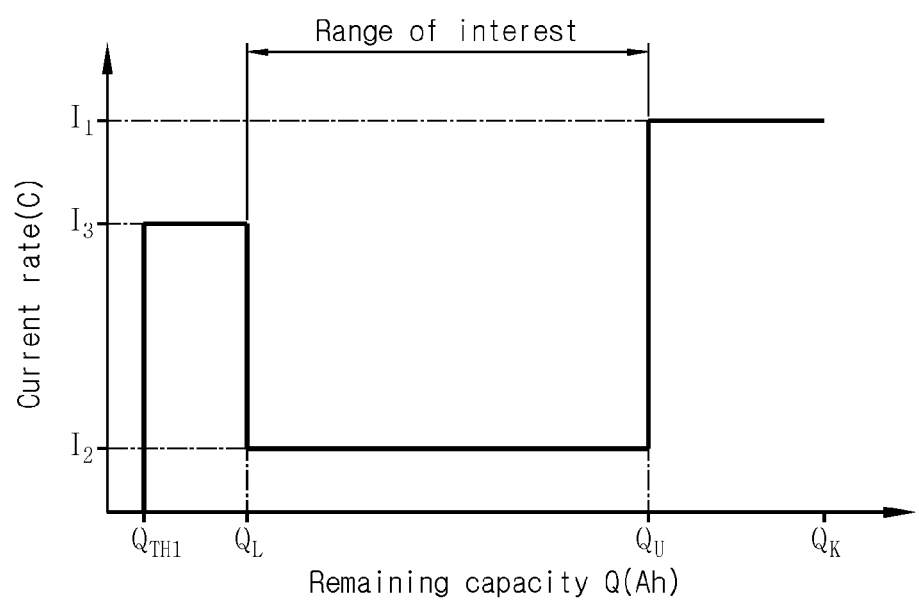
FIG. 4 is a graph referenced in describing the method of FIG. 3.

FIG. 3 is a flowchart illustrating the method for determining the differential voltage curve of the battery B using the apparatus 100 of FIG. 1, and FIG. 4 is a graph referenced in describing the method of FIG. 3. The method of FIG. 3 may start when the control unit 130 enters a curve determination mode, and may be repeated at each unit time until the remaining capacity of the battery B reaches a predetermined threshold. The control unit 130 may enter the curve determination mode when the battery B is fully charged. While the method of FIG. 3 is being performed, the control unit 130 may keep the switch SW in a turn-on state.

Referring to FIG. 3, in step S300, the control unit 130 determines a control history indicating the voltage V and the remaining capacity Q of the battery B based on a sensing signal.

In step S310, the control unit 130 determines a range of interest associated with the maximum capacity $Q_k$ from a first data table stored in the memory unit 140, using the maximum capacity $Q_k$ of the battery B as an index. The first data table records a correlation between the maximum capacity and the range of interest. As the battery B degrades, the position of the key feature point(s) on the differential voltage curve of the battery B gradually changes. By the step S310, it is possible to effectively track the change in position of the key feature point(s) on the differential voltage curve of the battery B by changing at least one of the upper limit and the lower limit of the range of interest according to the maximum capacity $Q_k$ corresponding to the degradation ratio of the battery B. For example, as the maximum capacity $Q_k$ reduces, at least one of the upper limit and the lower limit of the range of interest determined by the step S310 may reduce.

Alternatively, the range of interest may be preset irrespective of the maximum capacity $Q_k$. In this case, the step S310 may be omitted. For example, the upper limit and the lower limit of the range of interest may be the remaining capacity at SOC 60% and the remaining capacity at SOC 5% respectively.

In step S320, the control unit 130 determines at least first and second current rates associated with the maximum capacity $Q_k$ from a second data table stored in the memory unit 140, using the maximum capacity $Q_k$ of the battery B as an index. The control unit 130 may further determine a third current rate associated with the maximum capacity $Q_k$ from the second data table stored in the memory unit 140. The second data table records a correlation between the maximum capacity and the first to third current rates. As the battery B degrades, even a small change in the current flowing through the battery B may greatly change the voltage of the battery B. One of the causes is an increase in the internal resistance of the battery B. By the step S320, it is possible to prevent a distortion phenomenon of the position (i.e., the remaining capacity Q of the feature point) or the intensity (i.e., the differential voltage value dV/dQ of the feature point) of the key feature point(s) from the differential voltage curve of the battery B by changing a current rate of a constant current to be used to determine the differential voltage curve of the battery B according to the maximum capacity $Q_k$ corresponding to the degradation ratio of the battery B. For example, as the maximum capacity $Q_k$ reduces, at least one of the first to third current rates determined in the step S320 may reduce.

Alternatively, the first to third current rates may be preset irrespective of the maximum capacity $Q_k$. In this case, the step S320 may be omitted from the method of FIG. 3.

Hereinafter, assume that the first to third current rates are determined in the step S320 or preset. The first current rate and the third current rate may be higher than the second current rate, and the third current rate may be equal to or lower than the first current rate.

In step S330, the control unit 130 determines whether the remaining capacity Q of the battery B is equal to or higher than the upper limit $Q_U$ of the range of interest. When a value of the step S330 is "Yes", step S340 is performed. When the value of the step S330 is "No", step S350 is performed.

In step S340, the control unit 130 outputs a first request message to the constant current unit 120. The first request message is for inducing the constant current unit 120 to discharge the battery B with the constant current of the first current rate $I_1$ (e.g., 0.2~1 C). The constant current unit 120 discharges the battery B with the constant current of the first current rate $I_1$ in response to the first request message.

In step S350, the control unit 130 determines whether the remaining capacity Q of the battery B is equal to or lower than the lower limit $Q_L$ of the range of interest. When a value of the step S350 is "No", step S360 is performed. When the value of the step S350 is "Yes", step S370 is performed.

In step S360, the control unit 130 outputs a second request message to the constant current unit 120. The second request message is for inducing the constant current unit 120 to discharge the battery B with the constant current of the second current rate $I_2$ (e.g., 0.05 C) lower than the first current rate $I_1$. The constant current unit 120 discharges the battery B with the constant current of the second current rate $I_2$ in response to the second request message.

In step S370, the control unit 130 determines whether the remaining capacity Q of the battery B reached the predetermined threshold $Q_{TH1}$. The threshold $Q_{TH1}$ may be equal to or lower than the lower limit $Q_L$ of the range of interest. When a value of the step S370 is "No", step S380 is performed. When the value of the step S370 is "Yes", step S390 is performed.

In step S380, the control unit 130 outputs a third request message to the constant current unit 120. The third request message is for inducing the constant current unit 120 to discharge the battery B with the constant current of the third current rate $I_3$ higher than the second current rate $I_2$. The constant current unit 120 discharges the battery B with the constant current of the third current rate $I_3$ in response to the third request message. When the threshold $Q_{TH1}$ is equal to the lower limit $Q_L$ of the range of interest, the steps S370 and S380 may be omitted.

In step S390, the control unit 130 determines the differential voltage curve based on the control history recorded in the memory unit 140 at each unit time during the curve determination mode. Those skilled in the art will easily understand that the differential voltage curve determined in the step S390 will include information indicating the current SOH of the battery B.

Figure 5:
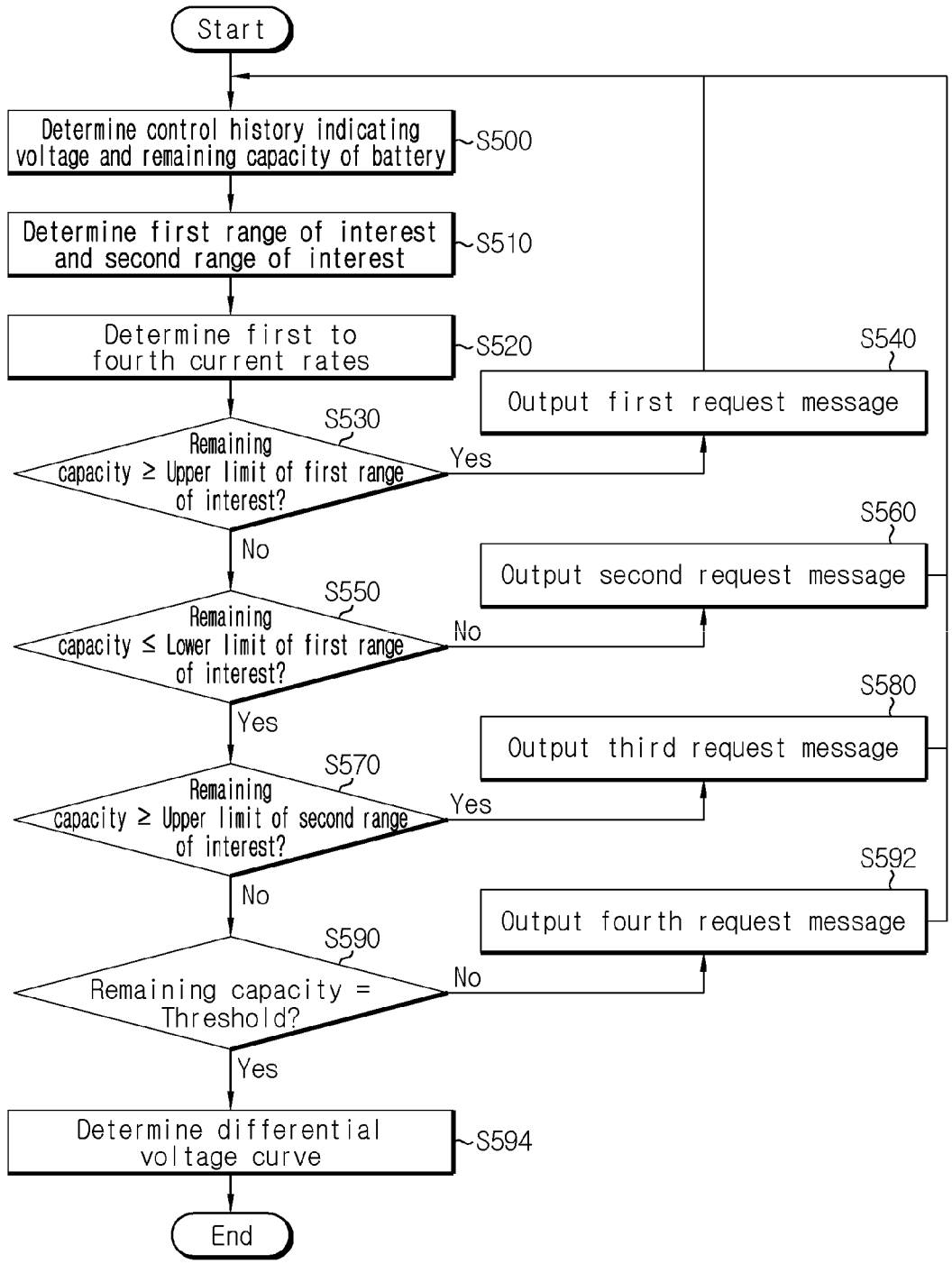
FIG. 5 is a flowchart illustrating another method for determining a differential voltage curve of a battery using the apparatus of FIG. 1.
Figure 6:
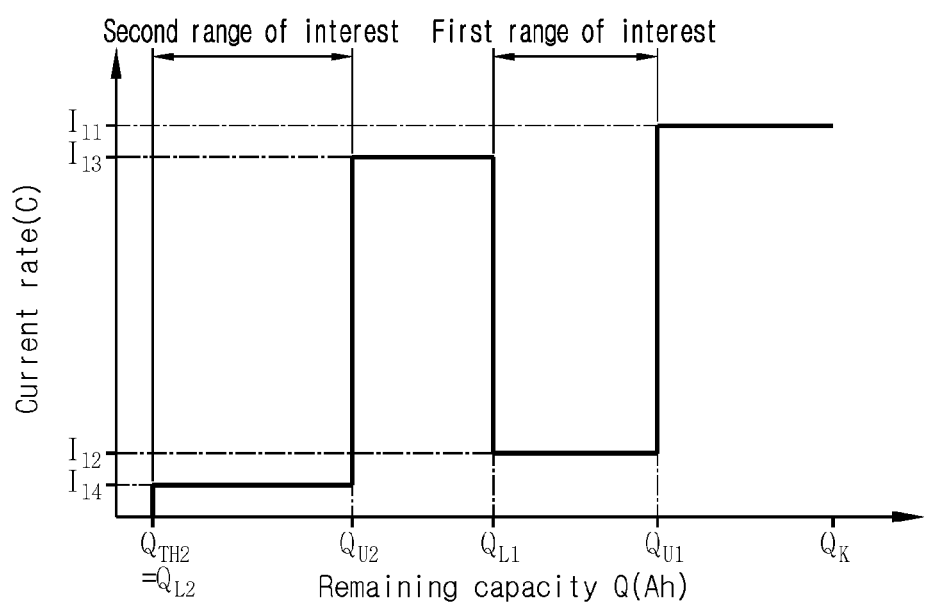
FIG. 6 is a graph referenced in describing the method of FIG. 5.

FIG. 5 is a flowchart illustrating another method for determining the differential voltage curve of the battery B using the apparatus of FIG. 1, and FIG. 6 is a graph referenced in describing the method of FIG. 5. The method of FIG. 5 may start when the control unit 130 enters the curve determination mode, and may be repeated at each unit time until the remaining capacity Q of the battery B reaches a predetermined threshold. The control unit 130 may enter the curve determination mode when the battery B is fully charged. While the method of FIG. 5 is being performed, the control unit 130 keeps the switch SW in a turn-on state. The method of FIG. 5 uses two ranges of interest, and this is a difference between the method of FIG. 5 and the method of FIG. 3 using a single range of interest.

Referring to FIG. 5, in step S500, the control unit 130 determines a control history indicating a voltage V and a remaining capacity Q of the battery B based on a sensing signal.

In step S510, the control unit 130 determines first and second ranges of interest corresponding to the maximum capacity $Q_k$ from a first data table stored in the memory unit 140 using the maximum capacity $Q_k$ of the battery B as an index. The first data table records a correlation between the maximum capacity and the first and second ranges of interest. For example, as the maximum capacity $Q_k$ reduces, at least one of the upper limit and the lower limit of at least one of the first range of interest and the second range of interest determined in the step S510 may reduce.

Alternatively, the first range of interest and the second range of interest may be preset irrespective of the maximum capacity $Q_k$. In this case, the step S510 may be omitted.

The first range of interest and the second range of interest do not overlap. For example, the upper limit $Q_{U1}$ and the lower limit $Q_{L1}$ of the first range of interest may be the remaining capacity at SOC 60% and the remaining capacity at SOC 40% respectively, and the upper limit $Q_{U2}$ and the lower limit $Q_{L2}$ of the second range of interest may be the remaining capacity at SOC 20% and the remaining capacity at SOC 5% respectively.

In step S520, the control unit 130 determines first to fourth current rates associated with the maximum capacity $Q_k$ from a second data table stored in the memory unit 140 using the maximum capacity $Q_k$ of the battery B as an index. The second data table may record a correlation between the maximum capacity and the first to fourth current rates. For example, as the maximum capacity $Q_k$ reduces, at least one of the first to fourth current rates determined in the step S520 may reduce.

Alternatively, the first to fourth current rates may be preset irrespective of the maximum capacity $Q_k$. In this case, step S520 may be omitted.

Hereinafter, assume that the first to fourth current rates are determined in the step S520 or preset. The first and third current rates are higher than the second and fourth current rates. The third current rate may be equal to or lower than the first current rate, and the fourth current rate may be equal to or lower than the second current rate.

In step S530, the control unit 130 determines whether the remaining capacity Q of the battery B is equal to or higher than the upper limit $Q_{U1}$ of the first range of interest. A value of the step S530 being "Yes" indicates that the remaining capacity Q of the battery B is outside of the first range of interest. When the value of the step S530 is "Yes", step S540 is performed. When the value of the step S530 is "No", step S550 is performed.

In step S540, the control unit 130 outputs a first request message to the constant current unit 120. The first request message is for inducing the constant current unit 120 to discharge the battery B with the constant current of the first current rate $I_{11}$ (e.g., 0.2~1 C). The constant current unit 120 discharges the battery B with the constant current of the first current rate $I_{11}$ in response to the first request message.

In step S550, determination is made as to whether the remaining capacity Q of the battery B is equal to or lower than the lower limit $Q_{L1}$ of the first range of interest. A value of the step S550 being "No" indicates that the remaining capacity Q of the battery B is within the first range of interest. When the value of the step S550 is "No", step S560 is performed. When the value of the step S550 is "Yes", step S570 is performed.

In step S560, the control unit 130 outputs a second request message to the constant current unit 120. The second request message is for inducing the constant current unit 120 to discharge the battery B with the constant current of the second current rate $I_{12}$ (e.g., 0.05 C) lower than the first current rate $I_{11}$. The constant current unit 120 discharges the battery B with the constant current of the second current rate $I_{12}$ in response to the second request message.

In step S570, the control unit 130 determines whether the remaining capacity Q of the battery B is equal to or higher than the upper limit $Q_{U2}$ of the second range of interest. A value of the step S570 being "Yes" indicates that the remaining capacity Q of the battery B is between the lower limit of the first range of interest and the upper limit of the second range of interest. When the value of the step S570 is "Yes", step S580 is performed. When the value of the step S570 is "No", the step S590 is performed.

In step S580, the control unit 130 outputs a third request message to the constant current unit 120. The third request message is for inducing the constant current unit 120 to discharge the battery B with the constant current of the third current rate $I_{13}$ higher than the second current rate $I_{12}$. The constant current unit 120 discharges the battery B with the constant current of the third current rate $I_{13}$ in response to the third request message.

In step S590, determination is made as to whether the remaining capacity Q of the battery B reached the threshold $Q_{TH2}$. The threshold $Q_{TH2}$ may be equal to or lower than the lower limit $Q_{L2}$ of the second range of interest. A value of the step S590 being "No" may indicate that the remaining capacity Q of the battery B is within the second range of interest. When the value of the step S590 is "No", step S592 is performed. When the value of the step S590 is "Yes", step S594 is performed.

In step S592, the control unit 130 outputs a fourth request message to the constant current unit 120. The fourth request message is for inducing the constant current unit 120 to discharge the battery B with the constant current of the fourth current rate $I_{14}$ lower than the third current rate $I_{13}$. The constant current unit 120 discharges the battery B with the constant current of the fourth current rate $I_{14}$ in response to the fourth request message.

In step S594, the control unit 130 determines the differential voltage curve based on the control history recorded in the memory unit 140 at each unit time while the control unit 130 is in the curve determination mode. Those skilled in the art will easily understand that the differential voltage curve determined in the step S594 will include information indicating the current SOH of the battery B.

Meanwhile, assume that the lower limit $Q_{L2}$ of the second range of interest is higher than the threshold $Q_{TH2}$. When the remaining capacity Q of the battery B is between the lower limit $Q_{L2}$ and the threshold $Q_{TH2}$, the step S540, S560 or S580 may be performed in place of the step S592.

Figure 7:
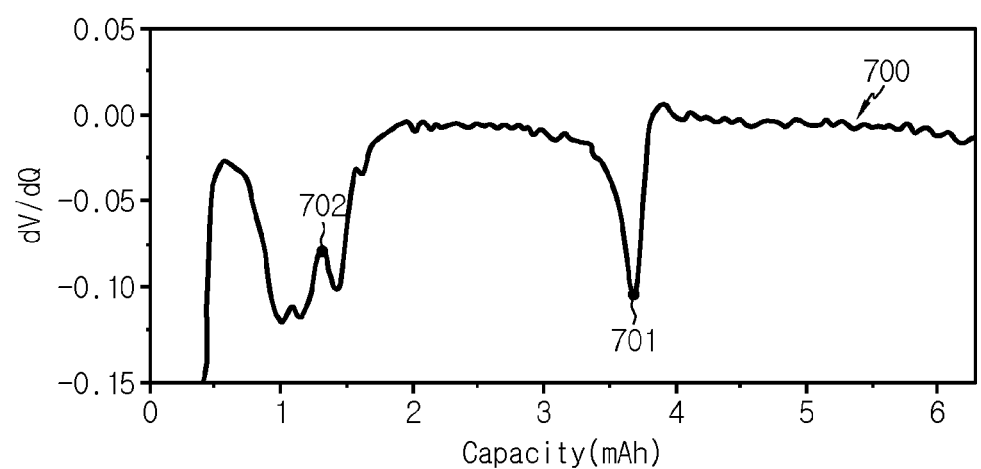
FIG. 7 is a graph illustrating a differential voltage curve according to comparative example 1.
Figure 8:
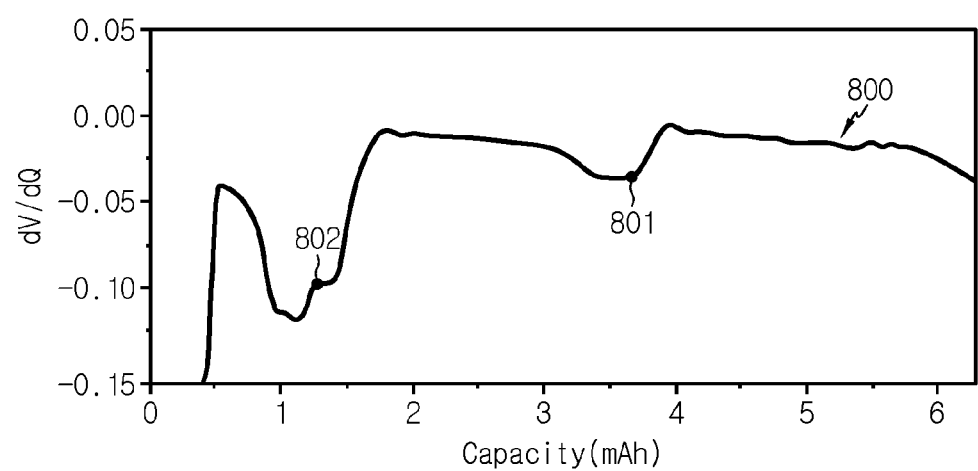
FIG. 8 is a graph illustrating a differential voltage curve according to comparative example 2.
Figure 9:
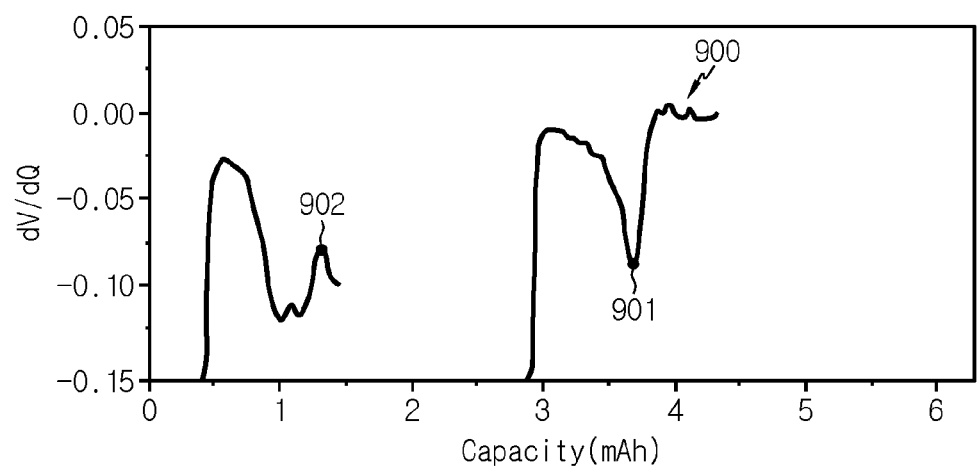
FIG. 9 is a graph illustrating a differential voltage curve obtained by the method of FIG. 5.

FIG. 7 is a graph illustrating a differential voltage curve according to comparative example 1, FIG. 8 is a graph illustrating a differential voltage curve according to comparative example 2, and FIG. 9 is a graph illustrating a differential voltage curve obtained by the method of FIG. 5.

Referring to FIGS. 7 to 9, the differential voltage curve 700 according to comparative example 1 (the conventional art) is determined through an experiment (about 20 h spent), in which a half cell manufactured using a negative electrode including graphite as a negative electrode material is discharged with a constant current of 0.05 C.

The differential voltage curve 800 according to comparative example 2 is determined through an experiment (about 10 h spent) in which the half cell is discharged with a constant current of 0.1 C.

The differential voltage curve 900 according to the method of FIG. 5 is determined through an experiment (about 9 h 48 m spent) in which the half cell is discharged with a constant current of 0.05 C within the first range of interest and the second range of interest, and is discharged with the constant current of 0.33 C higher than 0.05 C outside of the first range of interest and the second range of interest. The first range of interest is 2.88~4.32 mAh (corresponding to SOC 40~60%), and the second range of interest is 0~1.44 mAh (corresponding to SOC 0~20%). For convenience, the differential voltage curve 900 only shows a change in dV/dQ within the first range of interest and the second range of interest.

As a result, with regard to the first range of interest and the second range of interest, it is found that key feature points 901, 902 of the differential voltage curve 900 and key feature points 701, 702 of the differential voltage curve 700 have very similar positions and intensities. In contrast, it is found that there is a large difference in position (i.e., the remaining capacity Q) and intensity (i.e., differential voltage value dV/dQ) between the key feature points 901, 902 of the differential voltage curve 900 and key feature points 801, 802 of the differential voltage curve 800.

Figure 10:
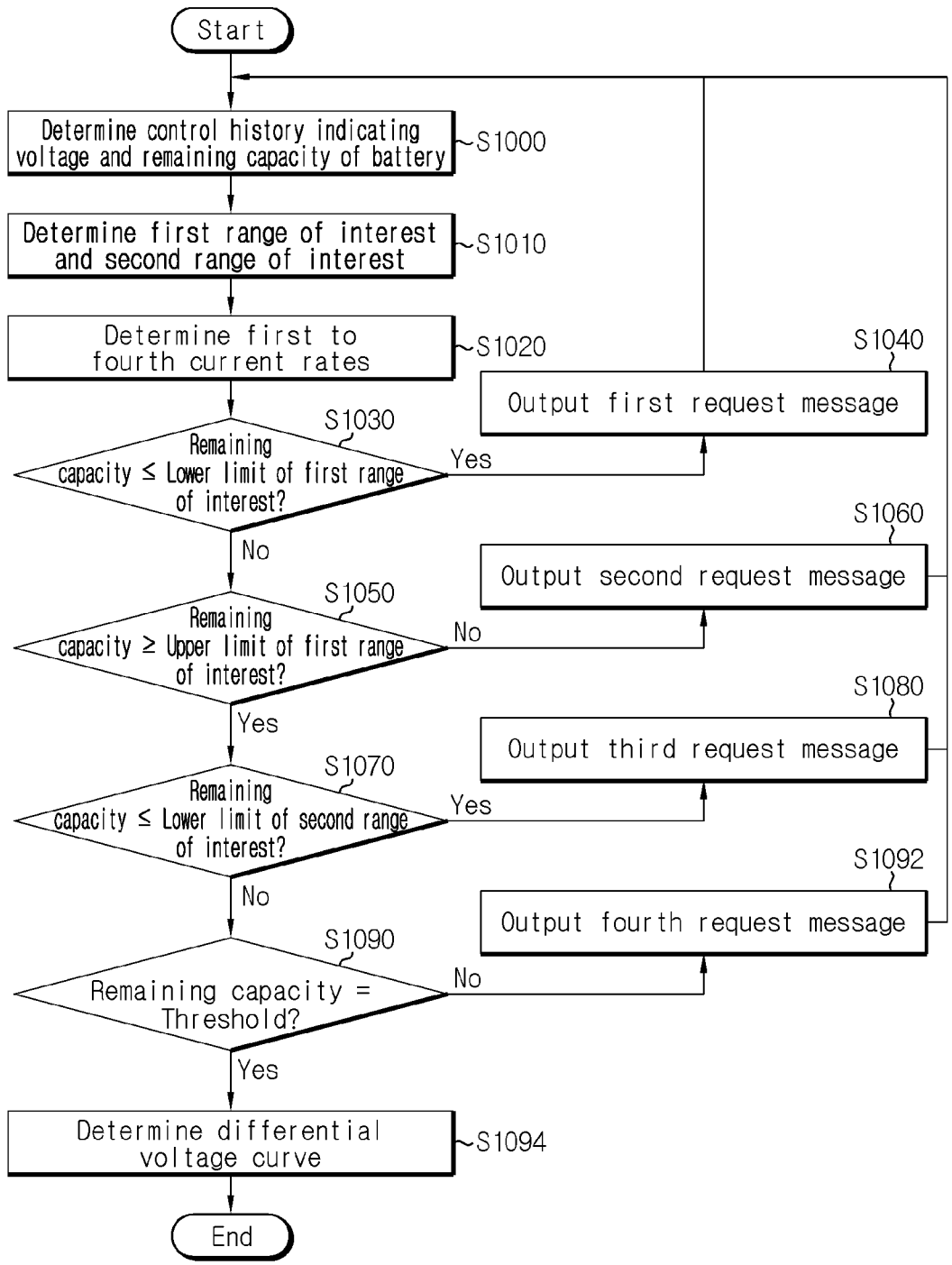
FIG. 10 is a flowchart illustrating still another method for determining a differential voltage curve of a battery using the apparatus of FIG. 1.

FIG. 10 is a flowchart illustrating still another method for determining the differential voltage curve of the battery using the apparatus of FIG. 1. The method of FIG. 10 may start when the control unit 130 enters the curve determination mode, and may be repeated at each unit time until the remaining capacity Q of the battery B reaches a predetermined threshold. As opposed to the methods of FIGS. 3 and 5, the control unit 130 may enter the curve determination mode when the battery B is fully discharged. While the method of FIG. 10 is being performed, the control unit 130 keeps the switch SW in a turn-on state. The method of FIG. 10 uses two ranges of interest, and this is a difference between the method of FIG. 10 and the method of FIG. 3 using a single range of interest.

Referring to FIG. 10, in step S1000, the control unit 130 determines a control history indicating a voltage V and a remaining capacity Q of the battery B based on a sensing signal.

In step S1010, the control unit 130 determines first and second ranges of interest corresponding to the maximum capacity $Q_k$ from a first data table stored in the memory unit 140 using the maximum capacity $Q_k$ of the battery B as an index. The first data table records a correlation between the maximum capacity and the first and second ranges of interest.

Alternatively, the first range of interest and the second range of interest may be preset irrespective of the maximum capacity $Q_k$. In this case, the step S1010 may be omitted.

The first range of interest and the second range of interest do not overlap. For example, as opposed to the embodiment associated with FIGS. 5 to 9, in the embodiment according to FIG. 10, the lower limit and the upper limit of the first range of interest may be the remaining capacity at SOC 0% and the remaining capacity at SOC 20% respectively, and the lower limit and the upper limit of the second range of interest may be the remaining capacity at SOC 40% and the remaining capacity at SOC 60% respectively.

In step S1020, the control unit 130 determines first to fourth current rates associated with the maximum capacity $Q_k$ from a second data table stored in the memory unit 140 using the maximum capacity $Q_k$ of the battery B as an index. The second data table records a correlation between the maximum capacity and the first to fourth current rates. Alternatively, the first to fourth current rates may be preset irrespective of the maximum capacity $Q_k$. In this case, the step S1020 may be omitted.

Hereinafter, assume that the first to fourth current rates are determined in the step S1020 or preset. The first and third current rates are higher than the second and fourth current rates. The third current rate may be equal to or lower than the first current rate, and the fourth current rate may be equal to or lower than the second current rate.

In step S1030, the control unit 130 determines whether the remaining capacity Q of the battery B is equal to or lower than the lower limit of the first range of interest. When a value of the step S1030 is "Yes", step S1040 is performed. When the value of the step S1030 is "No", step S1050 is performed.

In step S1040, the control unit 130 outputs a first request message to the constant current unit 120. The first request message is for inducing the constant current unit 120 to charge the battery B with the constant current of the first current rate (e.g., 0.2~1 C). The constant current unit 120 charges the battery B with the constant current of the first current rate in response to the first request message.

In step S1050, determination is made as to whether the remaining capacity Q of the battery B is equal to or higher than the upper limit of the first range of interest. When a value of the step S1050 is "No", step S1060 is performed. When the value of the step S1050 is "Yes", step S1070 is performed.

In step S1060, the control unit 130 outputs a second request message to the constant current unit 120. The second request message is for inducing the constant current unit 120 to charge the battery B with the constant current of the second current rate (e.g., 0.05 C) lower than the first current rate. The constant current unit 120 charges the battery B with the constant current of the second current rate in response to the second request message.

In step S1070, the control unit 130 determines whether the remaining capacity Q of the battery B is equal to or lower than the lower limit of the second range of interest. When a value of the step S1070 is "Yes", S1080 is performed. When the value of the step S1070 is "No", step S1090 is performed.

In step S1080, the control unit 130 outputs a third request message to the constant current unit 120. The third request message is for inducing the constant current unit 120 to charge the battery B with the constant current of the third current rate higher than the second current rate. The constant current unit 120 charges the battery B with the constant current of the third current rate in response to the third request message.

In step S1090, determination is made as to whether the remaining capacity Q of the battery B reached the threshold. The threshold may be equal to or higher than the upper limit of the second range of interest. When a value of the step S1090 is "No", step S1092 is performed. When the value of the step S1090 is "Yes", step S1094 is performed.

In step S1092, the control unit 130 outputs a fourth request message to the constant current unit 120. The fourth request message is for inducing the constant current unit 120 to charge the battery B with the constant current of the fourth current rate lower than the third current rate. The constant current unit 120 charges the battery B with the constant current of the fourth current rate in response to the fourth request message.

In step S1094, the control unit 130 determines the differential voltage curve based on the control history recorded in the memory unit 140 at each unit time while the control unit 130 is in the curve determination mode. Those skilled in the art will easily understand that the differential voltage curve determined in the step S1094 will include information indicating the current SOH of the battery B.

Meanwhile, assume that the upper limit of the second range of interest is lower than the threshold. When the remaining capacity Q of the battery B is between the upper limit of the second range of interest and the threshold, the step S1040, S1060 or S1080 may be performed in place of S1092.

The embodiments of the present disclosure described hereinabove are not implemented only through the apparatus and method, and may be implemented through programs that perform functions corresponding to the configurations of the embodiments of the present disclosure or recording media having the programs recorded thereon, and such implementation may be easily achieved by those skilled in the art from the disclosure of the embodiments previously described.

While the present disclosure has been hereinabove described with regard to a limited number of embodiments and drawings, the present disclosure is not limited thereto and it is obvious to those skilled in the art that various modifications and changes may be made thereto within the technical aspects of the present disclosure and the equivalent scope of the appended claims.

Additionally, as many substitutions, modifications and changes may be made to the present disclosure described hereinabove by those skilled in the art without departing from the technical aspects of the present disclosure, the present disclosure is not limited by the above-described embodiments and the accompanying drawings, and some or all of the embodiments may be selectively combined to allow various modifications.

What is claimed is:

1. An apparatus for determining a differential voltage curve of a battery, comprising:
   a constant current unit configured to control a current of the battery;
   a sensing unit configured to output a sensing signal indicating a voltage and the current of the battery at each unit time; and
   a control unit operably coupled to the sensing unit, the control unit being configured to:
     determine a control history indicating the voltage and a remaining capacity of the battery at each unit time based on the sensing signal;
     selectively output a first request message to the constant current unit, based on the remaining capacity when the remaining capacity is outside of a first range of interest; and
     output a second request message to the constant current unit when the remaining capacity is within the first range of interest,
   wherein the constant current unit is further configured to:
     discharge the battery with a constant current of a first current rate in response to the first request message, and discharge the battery with a constant current of a second current rate, lower than the first current rate, in response to the second request message, and wherein the control unit is further configured to determine the differential voltage curve, based on the control history when the remaining capacity reaches a threshold.

2. The apparatus according to claim 1, wherein:

the control unit is further configured to output a third request message to the constant current unit, when the remaining capacity is between a lower limit of the first range of interest and an upper limit of the second range of interest; and the constant current unit is further configured to discharge the battery with a constant current of a third current rate, higher than the second current rate, in response to the third request message.

3. The apparatus according to claim 2, wherein:

the control unit is further configured to output a fourth request message to the constant current unit, when the remaining capacity is within the second range of interest; and the constant current unit is further configured to discharge the battery with a constant current of a fourth current rate, lower than the third current rate, in response to the fourth request message.

4. The apparatus according to claim 3, wherein the fourth current rate is equal to or lower than the second current rate.

5. The apparatus according to claim 3, wherein the control unit is further configured to output the fourth request message to the constant current unit when the remaining capacity is lower than the upper limit of the second range of interest.

6. The apparatus according to claim 2, wherein the threshold is equal to or lower than a lower limit of the second range of interest.

7. The apparatus according to claim 1, wherein the control unit is further configured to determine the first range of interest associated with a maximum capacity of the battery from a first data table in which a correlation between the maximum capacity and the range of interest is recorded, using the maximum capacity of the battery as an index.

8. The apparatus according to claim 1, wherein the control unit is further configured to determine the first current rate and the second current rate associated with a maximum capacity of the battery from a second data table in which a correlation between the maximum capacity and the current rates are recorded, using the maximum capacity of the battery as an index.

9. The apparatus according to claim 1, wherein the control unit is further configured to output the first request message to the constant current unit when the remaining capacity is higher than an upper limit of the first range of interest.

10. A battery pack comprising the apparatus according to claim 1.

11. A method for determining a differential voltage curve using the apparatus according to claim 1, the method comprising:

determining, by the control unit, a control history indicating a voltage and a remaining capacity of the battery at each unit time;

selectively outputting, by the control unit, a first request message to the constant current unit, based on the remaining capacity when the remaining capacity is outside of a first range of interest, the first request message inducing the constant current unit to discharge the battery with a constant current of a first current rate to the constant current unit;

outputting, by the control unit, a second request message when the remaining capacity is within the first range of interest, the second request message inducing the constant current unit to discharge the battery with a constant current of a second current rate lower than the first current rate; and determining, by the control unit, the differential voltage curve, based on the control history when the remaining capacity reaches a threshold.

* * * * *